(12) United States Patent
Lee et al.

(10) Patent No.: US 9,659,648 B2
(45) Date of Patent: May 23, 2017

(54) SEMICONDUCTOR MEMORY DEVICE INCLUDING SWITCHES FOR SELECTIVELY TURNING ON BIT LINES

(71) Applicant: SK hynix Inc., Icheon-si, Gyeonggi-do (KR)

(72) Inventors: In Soo Lee, Icheon-si (KR); Jung Hyuk Yoon, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/019,095

(22) Filed: Feb. 9, 2016

(65) Prior Publication Data

US 2016/0155504 A1 Jun. 2, 2016

Related U.S. Application Data

(63) Continuation-in-part of application No. 13/720,917, filed on Dec. 19, 2012, now abandoned.

(30) Foreign Application Priority Data

Aug. 29, 2012 (KR) ........................ 10-2012-0095214

(51) Int. Cl.
| | |
|---|---|
| *G11C 13/00* | (2006.01) |
| *G11C 11/22* | (2006.01) |
| *G11C 7/10* | (2006.01) |
| *G11C 29/00* | (2006.01) |
| *G11C 7/12* | (2006.01) |
| *G11C 8/08* | (2006.01) |
| *G11C 8/12* | (2006.01) |

(52) U.S. Cl.
CPC ........ *G11C 13/0069* (2013.01); *G11C 7/1096* (2013.01); *G11C 11/2253* (2013.01); *G11C 11/2275* (2013.01); *G11C 13/0002* (2013.01); *G11C 13/0004* (2013.01); *G11C 13/0023* (2013.01); *G11C 29/785* (2013.01); *G11C 7/12* (2013.01); *G11C 8/08* (2013.01); *G11C 8/12* (2013.01); *G11C 2013/0088* (2013.01); *G11C 2207/005* (2013.01)

(58) Field of Classification Search
CPC ... G11C 13/0069; G11C 5/147; G11C 7/1096; G11C 13/0004; G11C 29/70; G11C 13/0023
See application file for complete search history.

(56) References Cited

U.S. PATENT DOCUMENTS

| | | | |
|---|---|---|---|
| 6,243,306 B1 * | 6/2001 | Kirihata | G11C 29/76 365/189.07 |
| 2008/0062741 A1 * | 3/2008 | Choi | G11C 13/0004 365/148 |

(Continued)

*Primary Examiner* — Khamdan Alrobaie
*Assistant Examiner* — Jerome Leboeuf
(74) *Attorney, Agent, or Firm* — William Park & Associates Ltd.

(57) ABSTRACT

A semiconductor memory device includes a plurality of first memory cells included in a first memory cell group and coupled to a plurality of first bit lines, respectively, a plurality of first switches coupled to the first bit lines, respectively, and coupled to a voltage node, a driver configured to supply a constant voltage to the voltage node for a write operation, and a switch control unit configured to selectively turn on one or more of the first switches when the write operation is performed.

12 Claims, 8 Drawing Sheets

(56) References Cited

U.S. PATENT DOCUMENTS

| | | | |
|---|---|---|---|
| 2010/0172171 A1* | 7/2010 | Azuma | G11C 13/003 365/148 |
| 2010/0202185 A1* | 8/2010 | Katoh | G11C 13/00 365/148 |
| 2012/0250437 A1* | 10/2012 | Nagata | G11C 7/18 365/200 |

* cited by examiner

SEMICONDUCTOR MEMORY DEVICE INCLUDING SWITCHES FOR SELECTIVELY TURNING ON BIT LINES

CROSS-REFERENCES TO RELATED APPLICATION

This application is a continuation-in-part of application Ser. No. 13/720,917, filed on Dec. 19, 2012, titled "SEMICONDUCTOR MEMORY DEVICE" and claims priority under 35 U.S.C. §119(a) to Korean application number 10-2012-0095214, filed on Aug. 29, 2012, in the Korean Intellectual Property Office, which is incorporated herein by reference in its entirety.

BACKGROUND

1. Technical Field

The present invention generally relates to a memory device, and more particularly, to a semiconductor memory device.

2. Related Art

In general, a phase change memory device is characterized in that it has a data processing speed almost equal to that of random access memory (RAM) and retains data even when power is off.

The voltage levels of a phase change memory device used when a write operation and a read operation are performed are relatively high. If a memory cell is selected and a write or read operation is performed as described above, a load on a line is increased because a word line WL or a bit line BL is activated within a plurality of cell matrices, with the result that a lot of current is consumed.

Since there is a plurality of current paths, a normal write operation may not be performed because an electric current is not regularly divided according to circumstances. In order to solve this problem, voltage from a write driver can be increased in order to increase current supply force, but reliability of data is deteriorated because a distribution of resistance values is widened due to the resistance of current paths. Accordingly, there is a need for a technique for preventing excessive current consumption and reducing the deterioration of performance due to an increased load on a line.

SUMMARY

A semiconductor device in accordance with an embodiment of the present invention may include a plurality of first memory cells included in a first memory cell group and coupled to a plurality of first bit lines, respectively, a plurality of first switches coupled to the first bit lines, respectively, and coupled to a voltage node, a driver configured to supply a constant voltage to the voltage node for a write operation, and a switch control unit configured to selectively turn on one or more of the first switches when the write operation is performed.

BRIEF DESCRIPTION OF THE DRAWINGS

Features, aspects, and embodiments are described in conjunction with the attached drawings, in which.

DETAILED DESCRIPTION

Hereinafter, a semiconductor memory device according to various embodiments will be described below with reference to the accompanying drawings through the embodiments.

Embodiments will be described based on phase change random access memory (PRAM). It is however evident to those skilled in the art that the embodiments can be applied to semiconductor memory devices including nonvolatile memory devices using resistant material, such as resistive RAM (RRAM) and ferroelectric RAM (FRAM).

Figure 1:
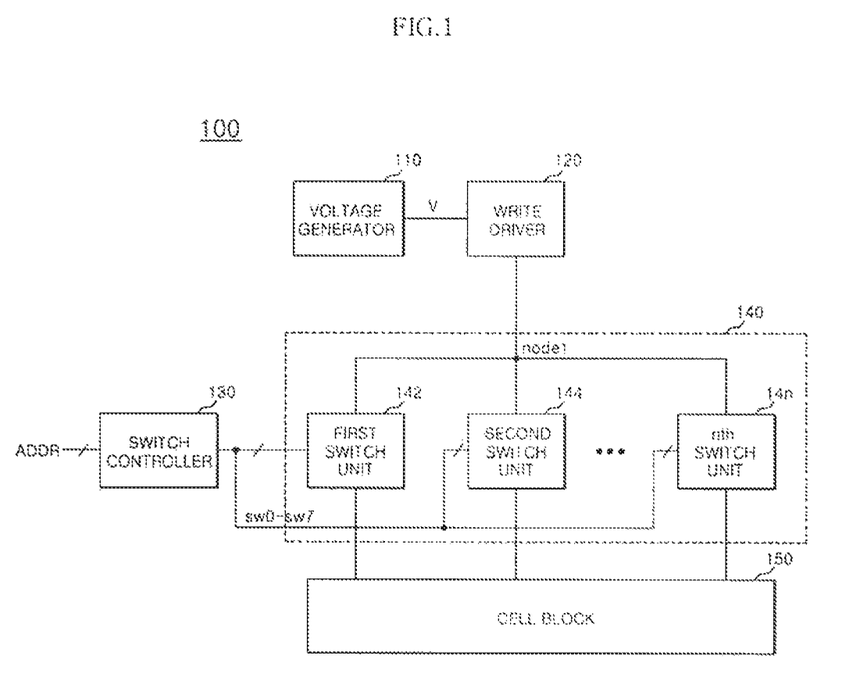
FIG. 1 shows the construction of a phase change memory device in accordance with an embodiment.
Figure 2:
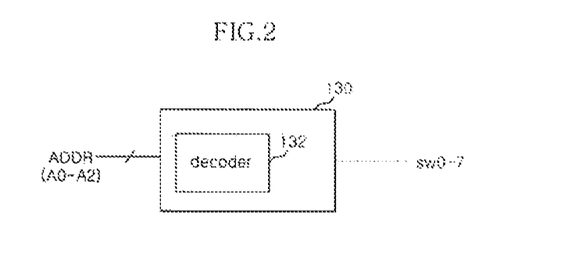
FIG. 2 is a block diagram of a switch controller of FIG. 1.

FIG. 1 shows the construction of a phase change memory device in accordance with an embodiment, and FIG. 2 is a block diagram of a switch controller of FIG. 1. First to third address signals ADDR A0-A2 are illustrated in FIG. 2, for convenience of description, but not limited thereto.

Referring to FIGS. 1 and 2, the phase change memory device 100 in accordance with an embodiment may include a voltage generator 110, a write driver 120, a switch controller 130, a switch block 140, and a cell block 150.

The voltage generator 110 may generate a specific high voltage V necessary when a write operation is performed. The voltage generator 110 is a common voltage generator that is understood by those skilled in the art, and thus a detailed description thereof is omitted.

The write driver 120 may receive the specific high voltage V and supply a write voltage regularly in response to a write command. The write driver 120 in accordance with an embodiment is illustrated as being a voltage source voltage source.

The switch controller 130 may supply a plurality of switch control signals SW0-SW7 in response to the address signals ADDR.

The switch controller 130 in accordance with an embodiment may provide the plurality of switch control signals so that the paths of write currents flowing through respective switch units 142, 144, ..., 14n may be controlled as a single path in order to reduce a load on the current of the write driver 120 when the write driver 120 is considered as a voltage source.

The switch controller 130 may include a decoder 132, as shown in FIG. 2. The switch controller 130 may receive the first to third address signals A0-A2, for example, and provide the 8 switch control signals SW0-SW7 obtained by decoding the 3 address signals. However, the embodiments are not limited to these examples, and the address signals can be added or reduced by taking the construction of the circuit or the voltage supply ability of the write driver into consideration. Furthermore, an additional MRS signal may also be used. It is important to use the switch units of the switch block 140 as signals the turn-on/off of which can be controlled in order to satisfy an object of the various embodiments.

The switch block 140 is described below.

The switch block 140 may include the plurality of switch units 142, 144, . . . , 14n.

Each of the switch units 142, 144, . . . , 14n may receive the plurality of switch control signals SW0-SW7 and supply a voltage path from the write driver 120 to the cell block 150 in response to the enabled switch control signals SW0-SW7.

Additionally, voltage at a node node 1 may be supplied from the write driver 120 and viewed from each of the switch units 142, 144, . . . , 14n, is substantially the same.

The cell block 150 may include a matrix of a plurality of nonvolatile memory cells. The rows of the plurality of nonvolatile memory cells are coupled with respective word lines (not shown), and a column of the plurality of nonvolatile memory cells is coupled with a bit line (not shown). Here, the nonvolatile memory cell can include a variable resistance element (not shown) configured to include a phase change material having a different resistance value depending on a crystalline state or an amorphous state and an access element (not shown) configured to control an electric current flowing through the variable resistance element. For example, the access element (not shown) can be a diode or a transistor that is coupled with the variable resistance element (not shown) in series.

In accordance with an embodiment, a constant voltage may be supplied to the node node1 that reaches cell selection paths using the write driver 120 as a voltage source. Furthermore, resistance between the cell selection paths can be made constant by selecting the cell selection paths that range from the write driver 120 to the memory cells of the cell block 150 using the switch units 142, 144 . . . 14n. Accordingly, when a write operation is performed, the shortage of a write current can be prevented.

Figure 3:
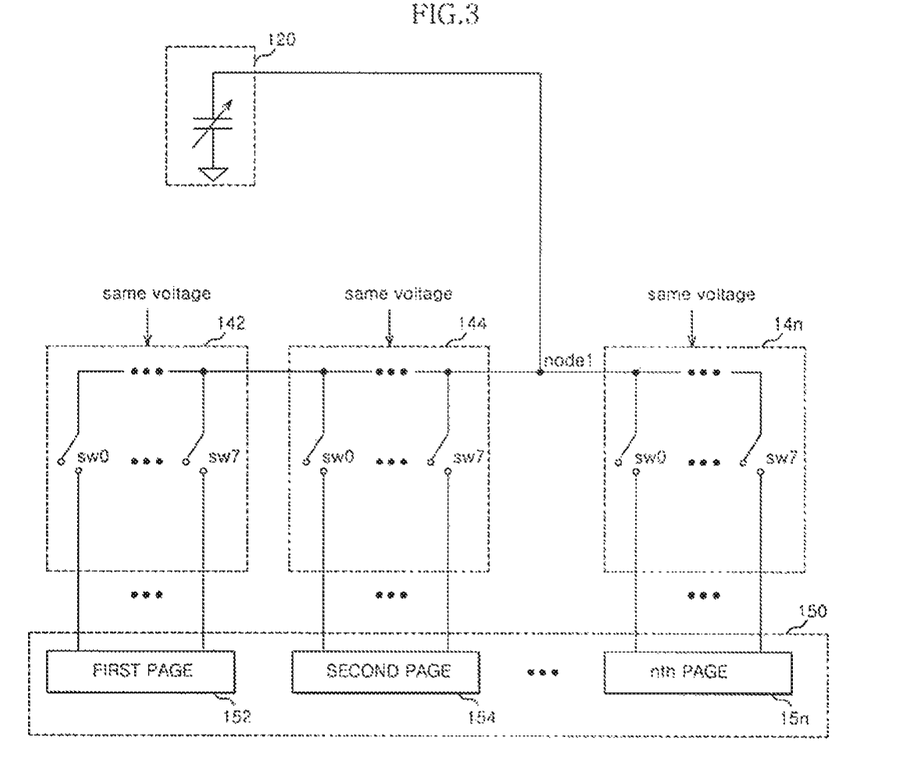
FIG. 3 is an equivalent circuit diagram of FIG. 1.

FIG. 3 is a simple equivalent circuit diagram for helping in the understanding of the write driver 120, the switch units 142, 144, . . . , 14n, and the cell block 150 of FIG. 1.

Various embodiments are described in detail with reference to FIG. 3.

Referring to FIG. 3, a constant voltage may be supplied from the write driver 120 to the switch units 142, 144, . . . , 14n (refer to node1).

The first switch unit 142 may include a plurality of switches the turning on or off of which may be controlled in response to the switch control signals SW0-SW7.

The second switch unit 144 may include a plurality of switches the turn-on/off of which may be controlled in response to the switch control signals SW0-SW7.

The nth switch unit 14n may include a plurality of switches the turn-on/off of which may be controlled in response to the switch control signals SW0-SW7.

Furthermore, the first switch unit 142 may be configured to correspond to the first page 152 of the cell block 150.

Likewise, the second switch unit 144 may be configured to correspond to the second page 154 of the cell block 150.

Additionally, the nth switch unit 14n may be configured to correspond to the nth page 15n of the cell block 150.

For example, in order to write data of 8 bits, 8 cells need not to be accessed at the same time within the first page 152 as in the prior art.

In an embodiment, for example, control can be performed so that one cell per page can be accessed and written.

More particularly, control can be performed so that the switches of the pages 152-15n can be turned by one switch per page in response to the enabled first switch control signals SW0. A load on voltage and current that must be handled by the write driver 120 is reduced because a cell selection path viewed from each page is a single path single path after the write driver 120 supplies a constant voltage. Accordingly, the current supply ability or voltage supply ability of the write driver 120 can be stabilized. Furthermore, the number of write drivers can be reduced depending on a circuit design configuration.

If other signals are added using the above principle, an application range can be further expanded.

Figure 4:
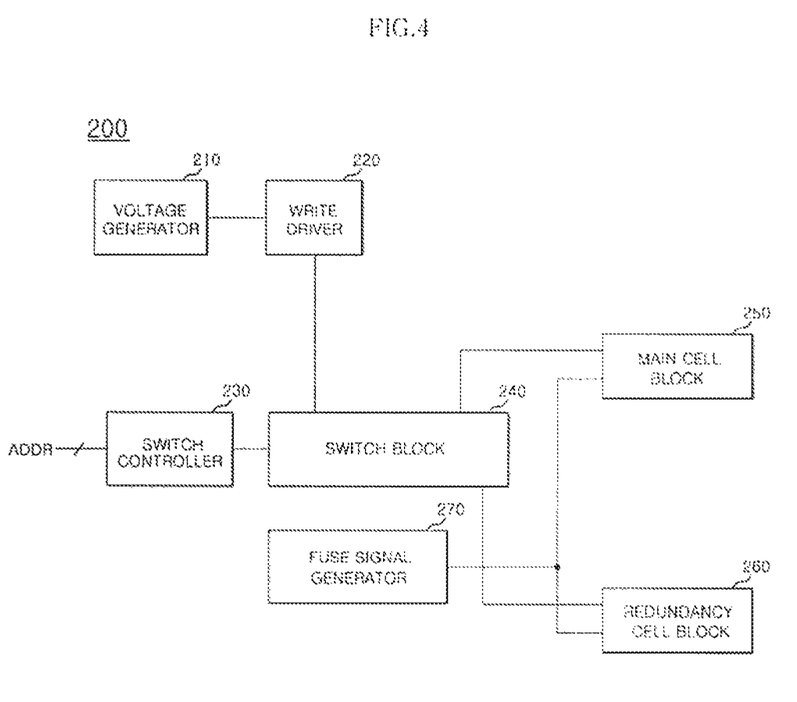
FIG. 4 shows the construction of a phase change memory device in accordance with an embodiment.

FIG. 4 shows the construction of a phase change memory device 200 in accordance with an embodiment.

FIG. 4 shows an example in which a write driver 220 may be used by a main cell block 250 and a redundancy cell block 260 in common.

Referring to FIG. 4, the phase change memory device 200 may include a voltage generator 210, the write driver 220, a switch controller 230 (capable of receiving address signals ADDR), a switch block 240, the main cell block 250, the redundancy cell block 260, and a fuse signal generator 270.

The voltage generator 210, the write driver 220, the switch controller 230, and the switch block 240 are redundant with those of FIG. 1, and thus a detailed description thereof is omitted.

In general, the redundancy cell block 260 may be provided in order to repair cells other than normal cells, that is, the main cell block 250. In the prior art, an additional write driver for the redundancy cell block 260 is provided.

In accordance with an embodiment, if the fuse signal of the fuse signal generator 270 is used and the switch control signals of the switch controller 230 and the switch block 240 are used, the write driver 220 may be used in the redundancy cell block 260.

That is, since a disabled fuse signal from the fuse signal generator 270 may be supplied to normal cells, the path of voltage from the write driver 220 may reach the main cell block 250 in response to the switch control signals of the switch controller 230.

If a failure cell within the main cell block 250 is sought to be repaired, the fuse signal generator 270 may supply the fuse signal and the path of voltage from the write driver 220 may reach the redundancy cell block 260 in response to the switch control signals of the switch block 240.

Figure 5:
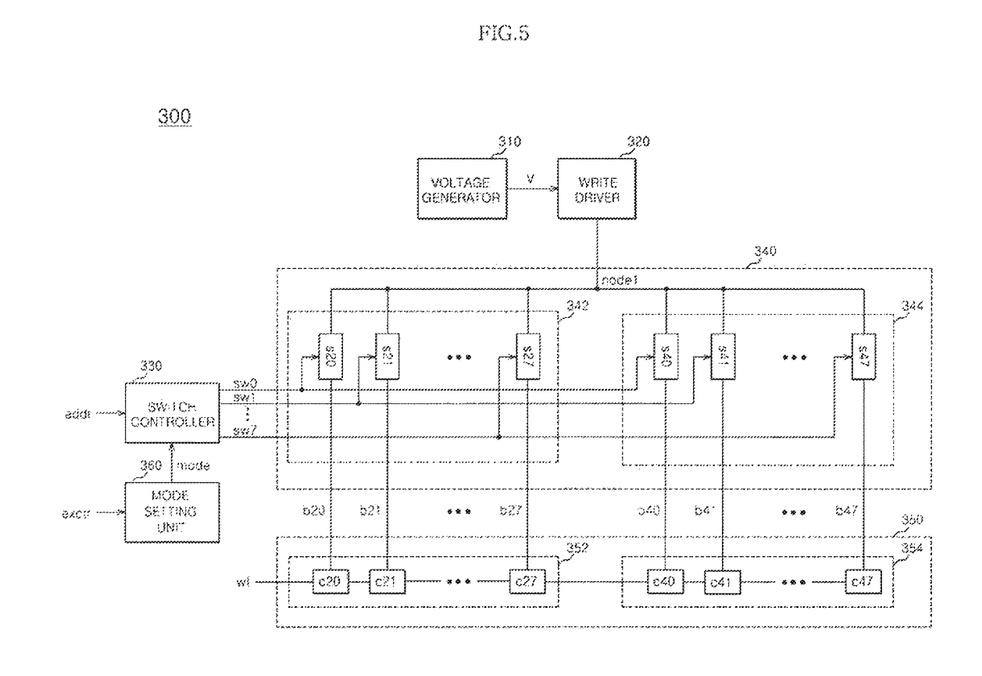
FIG. 5 is a block diagram showing a semiconductor device in accordance with an embodiment of the present invention.

FIG. 5 is a block diagram showing a semiconductor device 300 in accordance with an embodiment of the present invention. The configuration and operating method of the semiconductor device 300 of FIG. 5 may be similar to the semiconductor device 100 of FIG. 1. Accordingly, hereinafter, a description of the configuration and operating method similar to those of the semiconductor device 100 of FIG. 1 will be omitted.

The semiconductor device 300 may include a voltage generator 310, a write driver 320, a switch controller 330, a switch block 340, a cell block 350, and a mode setting unit 360.

The mode setting unit 360 may set the number of switches to be turned on at the same time in first and second switch units 342 and 344 and multi-switching mode different depending on continuity and an interval, may generate a mode signal mode in response to set multi-switching mode, and may provide the mode signal mode to the switch controller 330. Specifically, the mode setting unit 360 may set the number of switches to be turned on at the same time in the first and the second switch units 342 and 344. Furthermore, the mode setting unit 360 may determine whether or not to turn on switches corresponding to consecutive memory cells in the first and the second switch units 342 and 344, that is, may set the continuity of switches to be turned on at the same time. Furthermore, the mode setting unit 360 may determine whether or not to turn on switches corresponding to memory cells of a specific interval in the first and the second switch units 342 and 344, that is, may set an interval of switches to be turned on at the same time.

The mode setting unit 360 may autonomously set multi-switching mode depending on the operating conditions of the semiconductor device 300. For example, the mode setting unit 360 may set the number of switches that are turned on in the first and the second switch units 342 and 344 to "1" in order to reduce the amount of current consumption of the semiconductor device 300.

Meanwhile, when the number of switches turned on in the first and the second switch units 342 and 344 is set to "1", multi-switching mode may be defined as have been activated. When deactivating multi-switching mode, the mode setting unit 360 may not provide the mode signal mode to the switch controller 330 or may provide the mode signal mode of a specific value to the switch controller 330.

In some embodiments, the mode setting unit 360 may set multi-switching mode in response to an external control signal exctr provided by an external device (not shown). For example, when a test write operation is performed, the external device may provide the external control signal exctr so that all of the switches of the switch block 340 are turned on for fast write speed. When a test write operation is performed, the mode setting unit 360 may set the number of switches that are turned on at the same time in the first and the second switch units 342 and 344 to "8" in response to the external control signal exctr. As a result, the test write operation will be completed at fast speed because all of the memory cells of the cell block 350 are written at the same time.

The switch controller 330 may generate switch control signals sw0-sw7 in response to an address signal addr and the mode signal mode. The switch control signals sw0-sw7 may be applied to switches, respectively, included in the first and the second switch units 342 and 344. For example, the switch control signal sw0 may be applied to switches s20 and s40 included in the first and the second switch units 342 and 344.

As a result, the switch controller 330 may control the switches of the first and the second switch units 342 and 344 at the same time through the switch control signals sw0-sw7. Furthermore, the switch controller 330 may turn on a specific number of switches at the same time in each of the first and the second switch units 342 and 344 by selectively activating a specific number of the switch control signals sw0-sw7. The configuration and operating method of the switch controller 330 will be described in detail with reference to FIG. 6.

Meanwhile, when multi-switching mode is deactivated through the mode signal mode, the operating method of the switch controller 330 may be substantially the same as operating method of the switch controller 130 of FIG. 1. That is, the switch controller 330 may enable only one of the switch control signals sw0-sw7 in response to the address signal addr.

The switch block 340 may include the first and the second switch units 342 and 344. The switch block 340 of FIG. 5 has been illustrated as including the two switch units 342 and 344, but the number of switch units included in the switch block 340 is not limited thereto. The number of switch units may be substantially adjusted depending on the number of memory cell groups of a cell block 350.

The first switch unit 342 may include switches s20-s27. The first switch unit 342 has been illustrated as including the eight switches s20-s27, but the number of switches s20-s27 included in the first switch unit 342 is not limited thereto. The number of switches included in the first switch unit 342 may be substantially adjusted depending on the number of memory cells included in a first memory cell group 352.

The switches s20-s27 may be coupled to a voltage node node1 and coupled to bit lines b20-b27, respectively.

The switches s20-s27 may operate in response to the respective switch control signals sw0-sw7. Each of the switches s20-s27 may be turned on when each of the switch control signals is enabled and may be turned off when each of the switch control signals is disabled.

The second switch unit 344 may have substantially the same configuration as the first switch unit 342. Switches s40-s47 included in the second switch unit 344 may share the switch control signals sw0-sw7 along with the switches s20-s27 included in the first switch unit 342.

The cell block 350 may include the first and the second memory cell groups 352 and 354. The first and the second memory cell groups 352 and 354 may correspond to the first and the second switch units 342 and 344, respectively. The first and the second memory cell groups 352 and 354 may correspond to the pages 152 and 154 of FIG. 3, respectively.

The first memory cell group 352 may include the memory cells c20-c27. The memory cells c20-c27 may be coupled to the respective bit lines b20-b27. The memory cells c20-c27 may be coupled to a single word line.

When each of the switches is turned on, data may be written in each of the memory cells c20-c27 in response to a write pulse received through each of the bit lines from the voltage node node1.

The second memory cell group 354 may have substantially the same configuration as the first memory cell group 352. Memory cells c40-c47 included in the second memory cell group 354 may be coupled to the same word line as the memory cells c20-c27. In some embodiments, however, the second memory cell group 354 may be coupled to a word line different from a word line to which the first memory cell group 352 is coupled.

Figure 6:
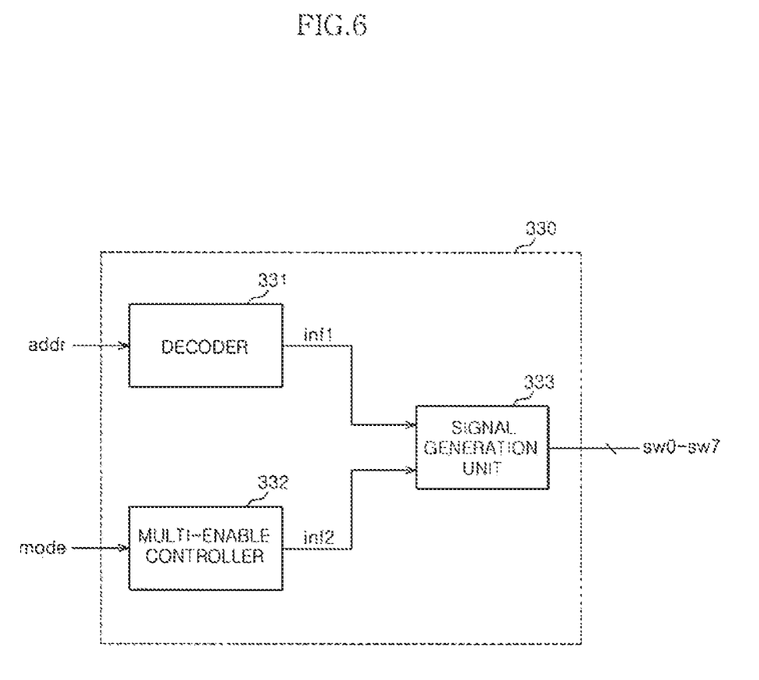
FIG. 6 is a block diagram illustrating a switch controller of FIG. 5.

FIG. 6 is a block diagram illustrating the switch controller 330 of FIG. 5.

The switch controller 330 may selectively enable the switch control signals sw0-sw7 in response to the address signal addr and the mode signal mode. The switch controller 330 may include a decoder 331, a multi-enable control unit 332, and a signal generation unit 333.

The decoder 331 may provide the signal generation unit 333 with information inf1 about any one of the switch control signals sw0-sw7 in response to the address signal addr. In other words, the decoder 331 may provide the signal generation unit 333 with the information inf1 about any one switch in each of the first and the second switch units 342 and 344 in response to the address signal addr. That is, the address signal addr may correspond to any one switch in each of the first and the second switch units 342 and 344. When multi-switching mode is deactivated, the address signal addr may be for specifying any one switch that is turned on in each of the first and the second switch units 342 and 344.

The multi-enable control unit 332 may provide the signal generation unit 333 with information inf2 about switches to be turned on at the same time in each of the first and the second switch units 342 and 344 in response to the mode signal mode. The information inf2 about switches to be turned on at the same time may include the number, continuity, and interval of switches that are turned on at the same time, for example.

The signal generation unit 333 may selectively enable the switch control signals sw0-sw7 in response to the information inf1 and inf2 transmitted by the decoder 331 and the multi-enable control unit 332. Specifically, the signal generation unit 333 may select a specific number of switches that belong to switches corresponding to the address signal addr in each of the first and the second switch units 342 and 344 and that are consecutive or spaced apart from each other at a specific interval, may enable switch control signals corresponding to the selected switches, and may disable switch control signals corresponding to the remaining switches.

Figure 7A:
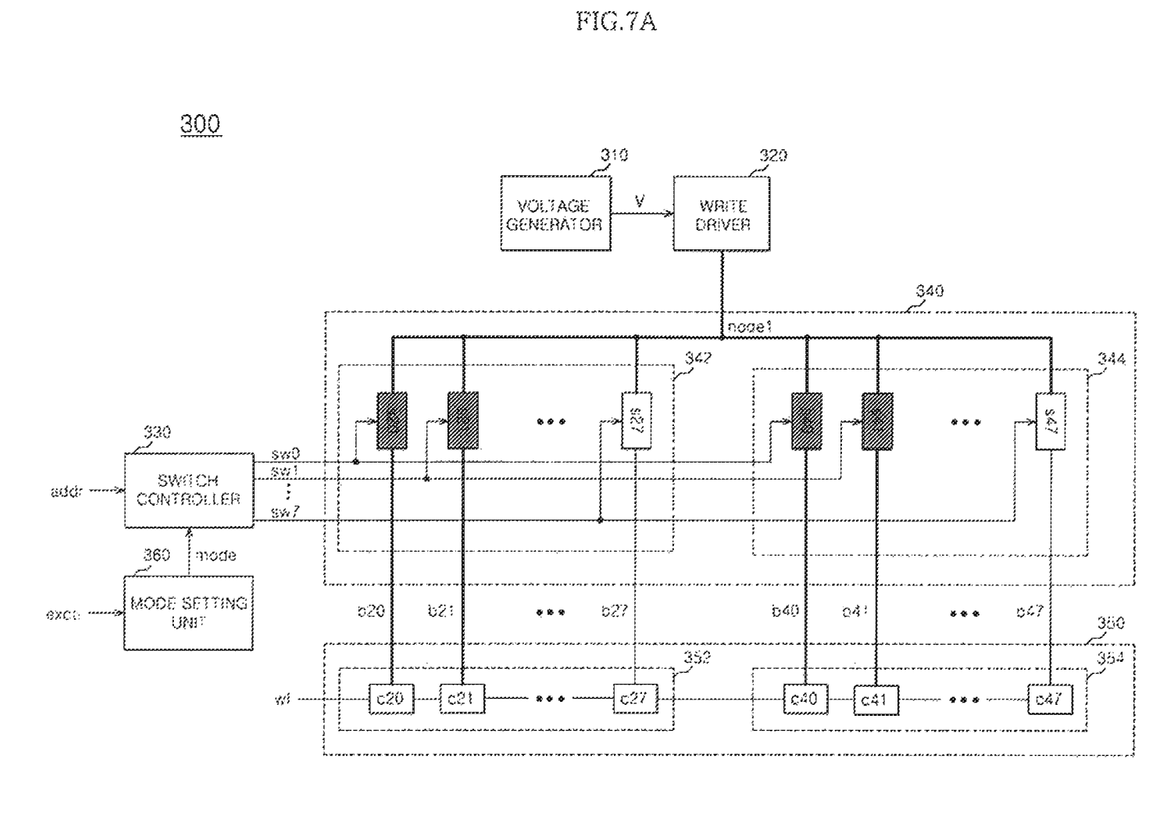
FIGS. 7A and 7B are diagrams illustrating the operation of the semiconductor device of FIG. 5.
Figure 7B:
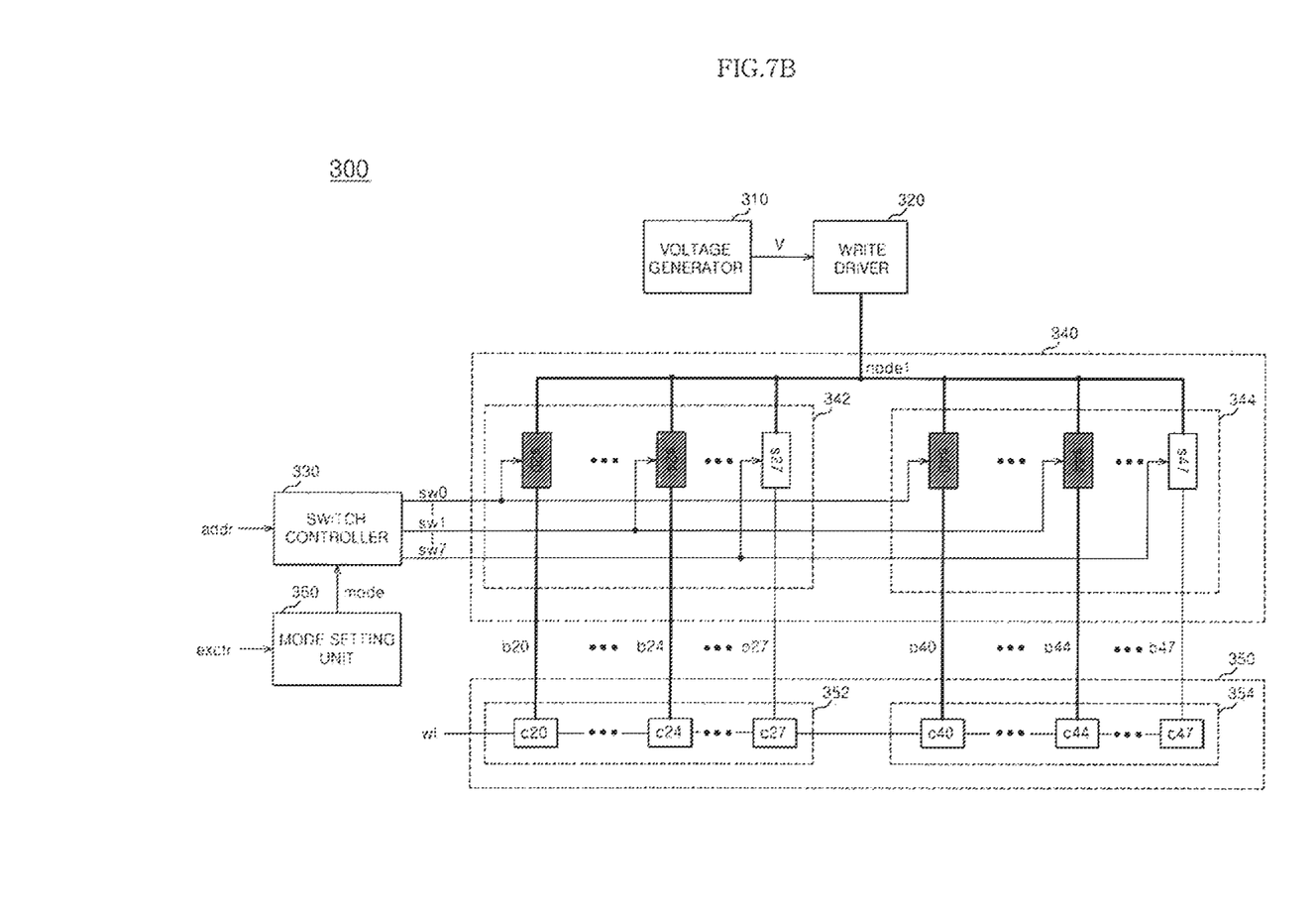

FIGS. 7A and 7B are diagrams illustrating the operation of the semiconductor device 300 of FIG. 5.

Referring to FIG. 7A, two switches s20, s21 and s40, s41 may be turned on in the first and the second switch units 342 and 344, respectively.

Specifically, the mode setting unit 360 may set multi-switching mode depending on operating conditions of the semiconductor device 300. The mode setting unit 360 may set multi-switching mode so that two consecutive switches of switches corresponding to the address signal addr in each of the first and the second switch units 342 and 344 are turned on and provide the mode signal mode to the switch controller 330 in accordance with set multi-switching mode.

The switch controller 330 may receive the address signal addr corresponding to the switch control signal sw0, for example. Accordingly, the switch controller 330 may enable the switch control signals sw0 and sw1 so that two consecutive switches s20 and s21 in the first switch unit 342 and two consecutive switches s40 and s41 in the second switch unit 344 are turned on in response to the address signal addr and the mode signal mode. Furthermore, the switch controller 330 may disable the remaining switch control signals sw2-sw7.

Data may be written in the memory cells c20, c21 and c40, c41 in response to a write pulse transmitted through the turned-on switches s20, s21 and s40, s41 and bit lines b20, b21 and b40, b41 from the voltage node node1.

In this case, the write pulse may be stably applied from the voltage node node1 to the memory cells c20, c21 and c40, c41 because the write driver 320 regularly maintains the voltage of the voltage node node1 when the write operation is performed.

Referring to FIG. 7B, the mode setting unit 360 may set multi-switching mode so that switches that belong to switches corresponding to the address signal addr and that are spaced apart from each other at a specific interval in each of the first and the second switch units 342 and 344 are turned on and provide the switch controller 330 with the mode signal mode in accordance with set multi-switching mode. For example, the mode setting unit 360 may set multi-switching mode so that the switches are turned on at an interval of "4" switches.

The switch controller 330 may receive the address signal addr corresponding to the switch control signal sw0, for example. Accordingly, the switch controller 330 may enable the switch control signal sw0 and the switch control signal sw4 corresponding to an interval of "4" switches with respect to the switch control signal sw0.

In FIG. 7B, the remaining operating methods will be omitted because they are similar to those described with reference to FIG. 7A.

Figure 8:
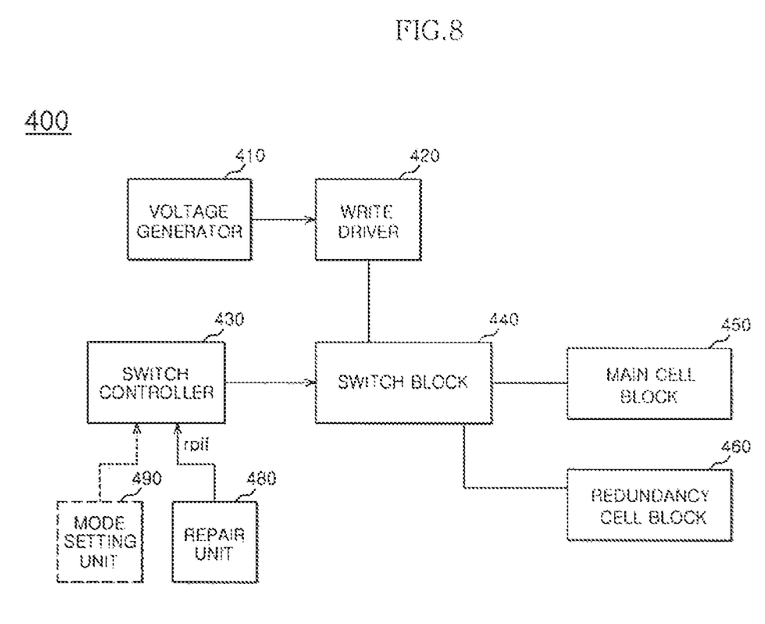
FIG. 8 is a block diagram showing a semiconductor device in accordance with an embodiment of the present invention.

FIG. 8 is a block diagram showing a semiconductor device 400 in accordance with an embodiment of the present invention. The configuration and operating method of the semiconductor device 400 of FIG. 8 may be similar to those of the semiconductor devices 100 and 300 of FIGS. 1 and 5. Accordingly, a description of the configuration and operating method similar to those of the semiconductor devices 100 and 300 of FIGS. 1 and 5 will be hereinafter omitted.

The semiconductor device 400 may include a voltage generator 410, a write driver 420, a switch controller 430, a switch block 440, a main cell block 450, a redundancy cell block 460, and a repair unit 480. In some embodiments, the semiconductor device 400 may further include a mode setting unit 490.

The redundancy cell block 460 may include repair memory cells for replacing defective memory cells in the main cell block 450.

The repair unit 480 may provide repair information rpif to the switch controller 430. The repair information rpif may include information about a defective memory cell and a repair memory cell for replacing the defective memory cell.

When turning on a switch corresponding to a defective memory cell, the switch controller 330 may also turn on a repair switch corresponding to a repair memory cell for replacing the defective memory cell in response to the repair information rpif. Accordingly, a write pulse may be applied to the defective memory cell and the repair memory cell at the same time.

Figure 9:
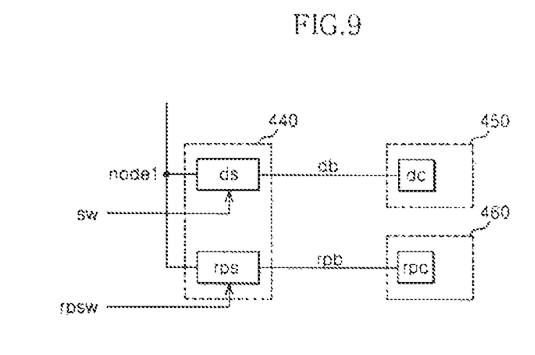
FIG. 9 is a diagram illustrating a repair memory cell and a repair switch corresponding to the repair memory cell.

FIG. 9 is a diagram illustrating a repair memory cell rpc and a repair switch rps corresponding to the repair memory cell rpc.

Referring to FIG. 9, the main cell block 450 may include a defective memory cell dc.

The redundancy cell block 460 may include the repair memory cell rpc for replacing the defective memory cell dc. The repair memory cell rpc may be coupled to a repair bit line rpb.

The switch block 440 may include a switch ds and the repair switch rps. The switch ds may be coupled between a bit line db and the voltage node node1 and turned on in response to a switch control signal sw.

The repair switch rps may be coupled between the repair bit line rpb and the voltage node node1 and turned on in response to a switch control signal rpsw.

Accordingly, when a write operation is performed, the switch control signals sw and rpsw are enabled at the same time. Accordingly, the switch ds and the repair switch rps may be turned on at the same time, and thus a write pulse from the voltage node node1 may be applied to the defective memory cell dc and the repair memory cell rpc at the same time.

FIG. 9 illustrates that different switch control signals sw and rpsw are applied to the switch sw and the repair switch rpsw. In some embodiments, however, the switch control signal may be applied to the switch sw and the repair switch rpsw.

Although various embodiments have been described above, other signals can be used in addition to the fuse signal.

In accordance with this technology, by regularizing the supply of an electric current from the write driver of the semiconductor memory device, a write operation can be stabilized, the number of write drivers, and thus area efficiency can be improved.

While various embodiments have been described above, it will be understood to those skilled in the art that the embodiments described are by way of example only.

Accordingly, the semiconductor memory device described herein should not be limited based on the described embodiments.

What is claimed is:

1. A semiconductor device, comprising:
   a plurality of first memory cells included in a first memory cell group and coupled to a plurality of first bit lines, respectively;
   a plurality of first switches coupled to the first bit lines, respectively, and coupled to a voltage node;
   a driver configured to supply a constant voltage to the voltage node for a write operation; and
   a switch control unit configured to selectively turn on one or more of the first switches in response to an address signal and a mode signal when the write operation is performed,
   wherein the switch control unit comprises:
   a decoder configured to generate information about one of the first switches in response to the address signal;
   a multi-enable control unit configured to generate information about first switches which are simultaneously turned on in response to the mode signal; and
   a signal generation unit configured to selectively enable switch control signals corresponding to the respective first switches in response to the information transmitted by the decoder and the multi-enable control unit.

2. The semiconductor device of claim 1, further comprising a mode setting unit which sets a multi-switching mode depending on operating conditions of the semiconductor device and generates the mode signal in accordance with the multi-switching mode.

3. The semiconductor device of claim 1, further comprising a mode setting unit which sets a multi-switching mode under a control of an external device and generates the mode signal in accordance with the multi-switching mode.

4. The semiconductor device of claim 3, wherein when a test write operation is performed, the mode setting unit sets the multi-switching mode so that all of the first switches are turned on under the control of the external device.

5. The semiconductor device of claim 1, wherein the mode signal comprises information about a number, continuity, and interval of first switches which are simultaneously turned on.

6. The semiconductor device of claim 1, further comprising:
   a plurality of second memory cells included in a second memory cell group and coupled to a plurality of second bit lines, respectively; and
   a plurality of second switches coupled to the second bit lines, respectively, and coupled to the voltage node,
   wherein when the write operation is performed, the switch control unit simultaneously turns on one or more of the first switches and one or more of the second switches.

7. The semiconductor device of claim 6, wherein when the write operation is performed, the switch control unit simultaneously turns on a specific number of the first switches and the specific number of the second switches.

8. The semiconductor device of claim 6, wherein:
   the switch control unit controls the first and the second switches through the switch control signals, and
   each of the switch control signals is simultaneously applied to a corresponding first switch of the first switches and a corresponding second switch of the second switches.

9. The semiconductor device of claim 1, wherein each of the first memory cells is written in response to a write pulse transferred through a corresponding first bit line from the voltage node, when a corresponding first switch is turned on.

10. The semiconductor device of claim 1, wherein the first memory cells are coupled to a single word line.

11. The semiconductor device of claim 1, further comprising:
    a repair memory cell coupled to a repair bit line and corresponding to a defective memory cell of the first memory cells; and
    a repair switch coupled to the repair bit line and the voltage node,
    wherein the switch control unit turns on the repair switch when turning on a first switch corresponding to the defective memory cell.

12. The semiconductor device of claim 11, further comprising a repair unit configured to provide the switch control unit with repair information comprising information about the defective memory cell and the repair memory cell.

* * * * *